United States Patent [19]

Sugahara et al.

[11] Patent Number: 4,714,684

[45] Date of Patent: Dec. 22, 1987

[54] METHOD OF FORMING SINGLE CRYSTAL LAYER ON DIELECTRIC LAYER BY CONTROLLED RAPID HEATING

[75] Inventors: Kazuyuki Sugahara; Tadashi Nishimura; Shigeru Kusunoki; Yasuo Inoue, all of Hyogo, Japan

[73] Assignee: Agency of Industrial Science and Technology, Tokyo, Japan

[21] Appl. No.: 844,324

[22] Filed: Mar. 26, 1986

[30] Foreign Application Priority Data

Jan. 9, 1986 [JP] Japan .................. 61-001465

[51] Int. Cl.$^4$ ............. H01L 21/263; C30B 13/06
[52] U.S. Cl. ................... 437/19; 427/53.1; 437/21; 437/173; 437/942; 437/235; 148/DIG. 93
[58] Field of Search ............. 148/1.5, 175; 29/576 B, 29/576 T; 427/53.1

[56] References Cited

U.S. PATENT DOCUMENTS

| | | | |
|---|---|---|---|
| 4,431,459 | 2/1984 | Teng | 148/1.5 |
| 4,514,895 | 5/1985 | Nishimura | 29/571 |
| 4,523,962 | 6/1985 | Nishimura | 148/1.5 |
| 4,543,133 | 9/1985 | Mukai | 148/1.5 |
| 4,545,823 | 10/1985 | Drowley | 148/1.5 |
| 4,619,038 | 10/1986 | Janning | 29/571 |

OTHER PUBLICATIONS

Mukai et al., Appl. Phys. Letts., 44, (1984), 994.
Lasky, Jour. Appl. Phys., 53, (1982), 9038.
Fowler et al., IBM-TDB, 22, (1980), 5473.
Okabayashi et al., Appl. Phys, Letts., 36, (1980), 202.
Colinge et al., Japanese Journal of Applied Physics, vol. 22, "The Use of Selective Annealing for Growing Very Large Grains in Silicon on Insulator Films", 1983, pp. 205–208.

Primary Examiner—Upendra Roy
Attorney, Agent, or Firm—Bernard, Rothwell & Brown

[57] ABSTRACT

In a method of manufacturing a semiconductor device of a three-dimensional structure having a semiconductor substrate and another single crystal semiconductor layer formed thereon, the another single crystal semiconductor layer is prepared by melting a vapor-deposited amorphous or polycrystalline semiconductor layer by the energy of laser beams then solidifying and converting the layer into single crystals. For initiating the melting at selected regions of the layer, the layer is formed at the surface thereof with a silicon nitride film of a uniform thickness and a silicon nitride film with a thickness at the region corresponding to the selected region different from that of the remaining region. The region thicker or thinner than other region reflects the laser energy at different reflectivity thereby to provide a desired temperature distribution.

7 Claims, 6 Drawing Figures

METHOD OF FORMING SINGLE CRYSTAL LAYER ON DIELECTRIC LAYER BY CONTROLLED RAPID HEATING

BACKGROUND OF THE INVENTION

Field of the Invention

This invention relates to an improvement for the method of manufacturing a semiconductor device and, more specifically, it relates to a method of forming a single crystal film of a semiconductor on a dielectric material and forming a transistor on the film as a substrate.

Description of the Prior Art

For increasing the operation speed of and the density of arranging semiconductor devices, there has been made an attempt for manufacturing a semiconductor integrated circuit with a low stray capacitance by isolating circuit devices with dielectric material, as well as an attempt for laminating the circuit devices vertically and horizontally, that is, manufacturing a so-called three-dimensional circuit device. One of the methods comprises forming a semiconductor layer on a dielectric material and constituting circuit devices in the semiconductor crystalline layer. Such a semiconductor crystalline layer can be formed by depositing a polycrystalline or amorphous semiconductor layer on the dielectric material and irradiating energy rays such as laser beams or electron beams to the surface thereby heating only the surface layer.

Referring to FIGS. 2a and 2b, there are shown a composite body of a semiconductor crystalline layer formed on a dielectric substrate in accordance with the conventional method. In FIGS. 2a and 2b, there are shown a single crystal silicon substrate 11, a silicon oxide film 12, a polycrystalline silicon film 13 and a silicon nitride film 14 deposited on the polycrystalline silicon film 13 and patterned as parallel stripes each of 5 μm width and arranged at 10 μm intervals. The silicon oxide film 12 is formed by a thermal oxidation process, and the polycrystalline silicon film 13 and the silicon nitride film 14 are formed by a chemical vapor deposition process (hereinafter simply referred to as a "CVD" process). The polycrystalline silicon film 13 can be melted and recrystallized, for example, by irradiating argon laser beams restricted to 100 μm diameter in parallel with the stripes of the silicon nitride film 14 at a scanning rate of 25 cm/sec. In this case, since the silicon nitride film 14 serves as a reflection-preventive film for the argon laser beams, the temperature of the polycrystalline silicon film 13 under the silicon nitride film 14 is kept higher than that of the polycrystalline silicon film 13 at the regions where the silicon nitride film 14 is absent. The solidification and recrystallization of the polycrystalline silicon film 13 occurs continuously from the lower temperature region with no silicon nitride film 14 and the regions of the polycrystalline silicon film 13 put between each of the stripes of the silicon nitride film 14 is converted into single crystals.

In the conventional method of irradiating laser beams to the semiconductor layer on the dielectric material for conversion into single crystals, since the silicon nitride film is in direct contact on the polycrystalline silicon, nitrogen atoms in the silicon nitride film intrude into the polycrystalline silicon upon recrystallization to worsen the crystallinity of silicon. Further, if a silicon oxide film is used as a reflection-preventive film, unevenness results to the surface of silicon after recrystallization although the intrusion of impurities into the polycrystalline silicon can be prevented.

SUMMARY OF THE INVENTION

The object of this invention is to provide a method of manufacturing an improved semiconductor device free from intrusion of impurities into the semiconductor layer and uneven thickness of the thus formed semiconductor layer upon melting under the irradiation of laser beams and subsequent conversion into single crystals.

Another object of this invention is to provide a method of manufacturing with ease a semiconductor device of a three-dimensional structure having two or more layers.

In one embodiment of this invention, the method of manufacturing a semiconductor device comprises:
forming a first dielectric layer on a semiconductor substrate,
forming an amorphous or polycrystalline semiconductor layer on the first dielectric layer,
forming a second dielectric layer on the semiconductor layer,
forming a third dielectric layer having regions with film thickness different from each other on the second dielectric layer, and
melting to recrystallize the semiconductor layer thereby converting the layer into single crystals by the irradiation of laser beams.

The second dielectric layer preferably comprises silicon oxide and the third dielectric layer desirably comprises silicon nitride. The silicon nitride film is composed of thick and thin regions in which the difference in the reflectivity between those regions of different thickness forms a desirable temperature distribution when the semiconductor layer is converted into single crystals upon irradiation of the laser beams.

DETAILED DESCRIPTION OF THE INVENTION

Figure 1A:
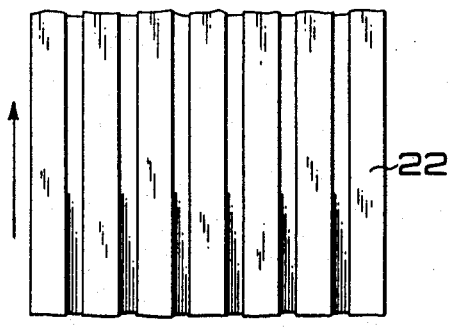
FIG. 1(a) is a plan view for a semiconductor plate to be processed by laser beam irradiation in the method of manufacturing a semiconductor device according to this invention and FIG. 1(b) is a vertical sectional view of the semiconductor plate.
Figure 2A:
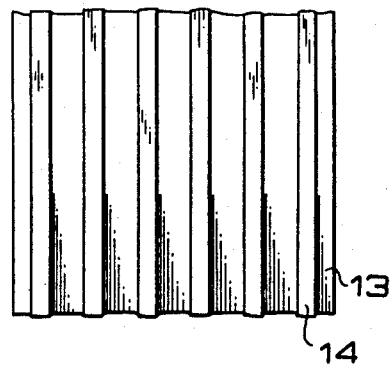
FIG. 2(a) is a plan view for a semiconductor plate processed by the conventional method of manufacturing a semiconductor device and FIG. 2(b) is a vertical cross sectional view of the semiconductor plate.
Figure 1B:
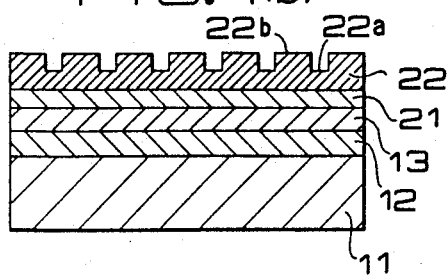
Figure 2B:
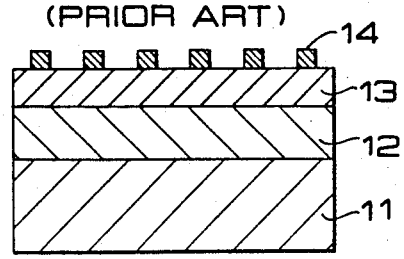

Referring now to FIGS. 1(a) and 1(b), there is shown a semiconductor plate processed by an energy beam irradiation step in the method of manufacturing a semiconductor device. The semiconductor plate comprises a semiconductor substrate 11, as well as a first dielectric layer 12, a semiconductor layer 13, a second dielectric layer 21 and a third dielectric layer 22 laminated in this order on the surface of the substrate. The third, that is, the uppermost dielectric layer 22 comprises two portions 22a and 22b of different thickness as explained specifically later.

The semiconductor substrate 11 may be a silicon wafer having any desired thickness and surface area, which may be already fabricated by the method known to the art so as to provide a desired semiconductor device structure.

In the case where the semiconductor substrate is made of silicon, the first dielectric layer 12 adjacent thereto preferably consists of silicon oxide formed by a known thermal oxidation process.

The first semiconductor layer 13 above and adjacent to the first dielectric layer 12 may be made of amorphous or polycrystalline, that is, not-single crystal semiconductor material, for example, silicon. The amorphous or polycrystalline silicon layer may be formed by a CVD process.

According to the method of this invention, the second and the third dielectric layers 21 and 22 are present on the semiconductor layer 13. In the case where the semiconductor layer 13 is made of silicon, the second dielectric layer is preferably made of silicon oxide, which may be formed with ease by the CVD process in the same manner as in the case of the first dielectric layer 12.

The third dielectric layer 22 consists of two portions 22a and 22b with thickness different from each other. Each of the thin portions 22a is formed below the bottom of a plurality of grooves having a width and depth equal to each other and disposed at a uniform pitch and, accordingly, the thick portions 22b correspond to those portions other than the grooves. Although there are no particular restrictions for the width of the portions 22a and 22b, it is preferred that each portion 22a has a width of about 5 μm and each portion 22b has a width of about 10 μm. The third dielectric layer 22 is preferably made of silicon nitride.

A method of forming a dielectric layer having such grooves comprises forming a silicon nitride film of a desired thickness on the second dielectric layer 21 by a CVD process, forming a plurality of grooves each having a predetermined width and depth by using a known photo etching technology, and forming a silicon nitride film on the thus formed silicon nitride film having grooves by using a CVD process. That is, the thickness of the thicker portion 22b corresponds to the sum of the thickness of the films prepared respectively in the successive two vapor deposition steps, while the thickness for the thinner portion 22a corresponds to the thickness of the thicker portion substrated with the thickness removed by the etching. The thickness of the portions 22a and 22b of the third dielectric layer 22, as well as the thickness of the second dielectric layer 21 situated therebelow, are important factors in the method of this invention.

Figure 3A:
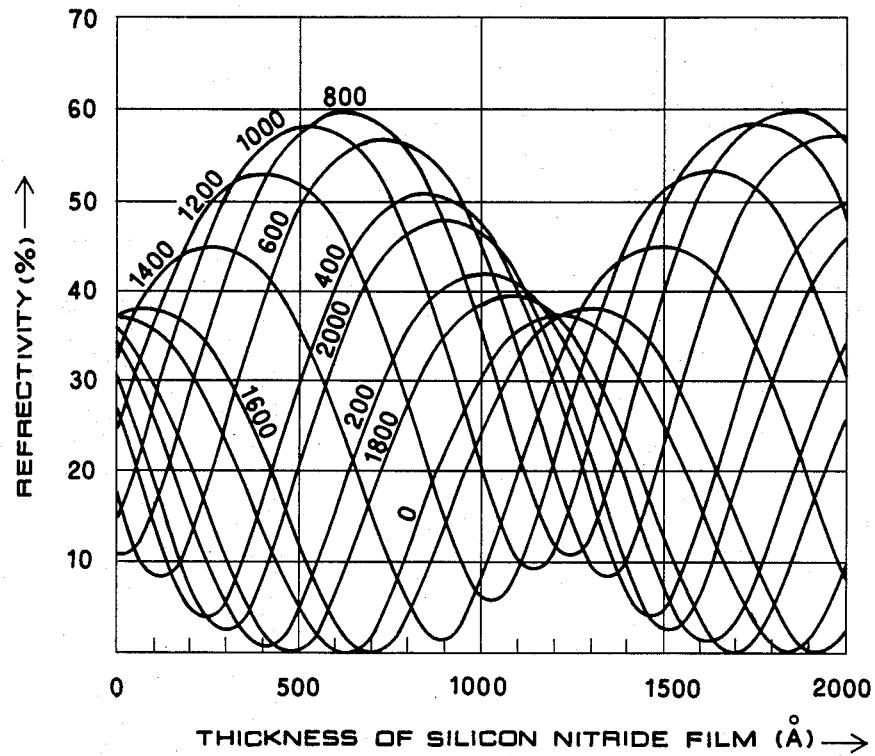
FIG. 3(a) is a graph showing the relationship between the thickness and the reflectivity of the silicon nitride film relative to the laser beams at a wavelength of 4880 Å.
Figure 3B:
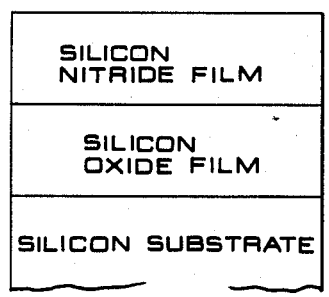
FIG. 3(b) shows a structure of a semiconductor plate used for the measurement of the reflectivity.

FIG. 3(a) shows the relationship between the thickness of the silicon nitride film (Å) and the reflectivity (%). As shown in FIG. 3(b), the relationship shows the result of the measurement for the reflectivity relative to the light at a wavelength of 4880 Å on the surface of the silicon nitride film for each of a plurality of samples prepared by laminating silicon oxide film and silicon nitride film of various thickness by using the thickness of the silicon oxide film as the parameter, in which numeral values attached to each of the curves in the graph indicate by Å unit the thickness of the silicon oxide film.

The results in FIG. 3(a) show that the reflectivity of the composite body composed of the silicon oxide film and the silicon nitride film formed on the silicon substrate against the light of a wavelength at 4880 Å varies within a broad range from about 0% to 60% depending on the thickness of the silicon oxide film and the silicon nitride film. The energy of light not reflected is absorbed in the silicon nitride film, silicon oxide film and the silicon substrate and converted into heat energy. As the result, the temperature of the silicon substrate rises in inverse proportion with the reflectivity.

It has been confirmed by experiment that the above-mentioned relationship can be established for laser beams at various wavelength from all of the laser beam sources put to practical use at present.

The principle of this invention is based on forming a lower dielectric film of a predetermined uniform thickness and an upper dielectric film of varying thickness on an amorphous or polycrystalline silicon film so that a layer having differing reflectivity and a desired temperature distribution is intentionally formed to the amorphous polycrystalline silicon film upon irradiation of laser beams by utilizing the partial difference in the reflectivity of the composite film.

From various experiments including the results as shown in FIG. 3(a), it has been found that the difference in the reflectivity required for causing a desired temperature distribution to the silicon film can be achieved when the upper dielectric layer has a different thickness at desired portions or regions from the remaining portions or regions.

In one particular embodiment where the lower and upper dielectric films are made of silicon oxide and silicon nitride respectively, a desired difference in the reflectivity against the laser beams at the wavelength of 4880 Å can be obtained in the case where the thickness of the silicon oxide film is from 0.04 to 0.07 μm and the silicon nitride film comprises thinner portion of from 0.01 to 0.03 μm and thicker portion of from 0.05 to 0.1 μm; and where the thickness of the silicon oxide film is from 0.07 to 0.1 μm and the silicon nitride film comprises thinner portion of less than 0.03 μm (which may be possibly be removed entirely depending on the case) and thicker portion of from 0.04 to 0.1 μm.

Again referring to FIG. 1(b), the illustrated semiconductor plate comprises a silicon oxide film 12 of about 1 μm thickness, a polycrystalline silicon film 13 of about 0.5 μm thickness, a silicon oxide film 21 of about 0.04 μm thickness and a silicon nitride film 22 composed of the region 22a of about 0.025 μm thickness and the region 22b of about 0.085 μm thickness.

Beams of continuous oscillating argon laser at the wavelength of 4880 Å and restricted to a diameter of 100 μm were irradiated onto the semiconductor plate having the foregoing structure while scanning in parallel with the stripes of the silicon nitride film 22 in the direction of the arrow shown in FIG. 1(a) at a velocity of 25 cm/sec. In the silicon nitride film 22, since the reflectivity of the laser beams in the region 22a of 0.025 μm thickness is smaller than that in the region 22b of 0.085 μm thickness as shown in FIG. 3, more laser power is absorbed in this region 22a to the polycrystalline silicon layer 13 therebelow. Accordingly, the temperature for the polycrystalline silicon 13 below the silicon nitride film 22a of 0.025 μm thickness is higher than that for the polycrystalline silicon 13 below the silicon nitride film 22b of 0.085 μm thickness. Since the solidification and re-crystallization occurs continuously from the polycrystalline silicon below the silicon nitride film 22b of 0.085 μm thickness at a lower temperature, the polycrystalline silicon film 13 is grown into single crystals over a large area. In this case, since the silicon oxide film 21 is present over the entire surface of the polycrystalline silicon film 13, neither the nitrogen atoms are intruded from the silicon nitride film 22 to the polycrystalline silicon 13 nor does unevenness result to the surface due to the silicon nitride film 22. By eliminating the silicon nitride film 22 and the silicon oxide film 21 after the irradiation of the laser beams, transistors or like other devices can be manufactured on the polycrystalline silicon 13 now converted into single crystals.

Although two dielectric layers are disposed on the polycrystalline silicon film 13 in the above embodiment, three or more layers may be employed so long as a desired reflectivity can be obtained.

As described above, according to this invention, since a silicon oxide film is formed over the semiconductor layer on the dielectric material and a silicon nitride film having the distribution of the thickness is further formed thereover, a desired temperature distribution can be formed in the semiconductor layer upon irradiation of laser beams and the intrusion of impurities can be decreased to thereby obtain a semiconductor layer at a high quality.

What is claimed is:

1. A method of manufacturing a semiconductor device comprising:

forming a first dielectric layer on a semiconductor substrate, forming an amorphous or polycrystalline semiconductor layer on said first dielectric layer, forming a second dielectric layer of substantially uniform thickness on said semiconductor layer, forming a third dielectric layer on said second dielectric layer, said third dielectric layer being flat on its lower surface but having a plurality of parallel grooves in its upper surface to form regions at the bottom of said grooves having a lesser thickness than the thickness of the remaining regions thereof, and melting and recrystallizing said semiconductor layer by the irradiation of laser beams thereby converting said semiconductor layer into single crystals.

2. A method of manufacturing a semiconductor device as defined in claim 1, comprising the semiconductor substrate composed of silicon, the first and second dielectric layers both composed of silicon oxide and the third dielectric layer composed of silicon nitride.

3. A method of manufacturing a semiconductor device as defined in claim 2, wherein the thickness of the second dielectric layer is within a range from 0.04 to 0.07 $\mu$m and the third dielectric layer comprises a region of a thickness from 0.01 to 0.03 $\mu$m and a region of a thickness from 0.05 to 0.1 $\mu$m.

4. A method of manufacturing a semiconductor device as defined in claim 2, wherein the thickness of the second dielectric layer is within a range from 0.07 to 0.1 $\mu$m and the third dielectric layer comprises a region of a thickness from 0 to 0.03 $\mu$m and a region of a thickness from 0.04 to 0.1 $\mu$m.

5. A method of manufacturing a semiconductor device as defined in claim 2, wherein the step of forming the third dielectric layer comprises; forming a silicon nitride film of a desired thickness on the second dielectric layer; removing the thus formed silicon nitride layer from desired regions and then forming another silicon nitride film on said silicon nitride film.

6. A method of manufacturing a semiconductor device as defined in claim 5, wherein said silicon nitride film and said another silicon nitride film are formed by the CVD process.

7. A method of manufacturing a semiconductor device as defined in claim 5, wherein the step of removing a portion of the silicon nitride film is carried out by a photo-etching process.

* * * * *

UNITED STATES PATENT AND TRADEMARK OFFICE
CERTIFICATE OF CORRECTION

PATENT NO. : 4,714,684

DATED : December 22, 1987

INVENTOR(S) : Kazuyuki Sugahara et al.

It is certified that error appears in the above-identified patent and that said Letters Patent is hereby corrected as shown below:

On the Title Page, Item [73] Assignee: should read

--Itaru Todoriki
  Director General, Agency of Industrial Science
    and Technology--.

Signed and Sealed this

Twenty-sixth Day of July, 1988

*Attest:*

DONALD J. QUIGG

*Attesting Officer*  *Commissioner of Patents and Trademarks*